United States Patent [19]

Grogan

[11] 4,313,094

[45] Jan. 26, 1982

[54] MODULATION DEVICE FOR SUBSTITUTING FOR A DOUBLE BALANCED MIXER

[75] Inventor: Martin L. Grogan, Marion, Iowa

[73] Assignee: Rockwell International Corporation, El Segundo, Calif.

[21] Appl. No.: 85,831

[22] Filed: Oct. 17, 1979

[51] Int. Cl.³ .......................... H03C 1/58; H03D 1/10
[52] U.S. Cl. ............................... 332/43 R; 332/23 R; 332/31 R; 332/47; 332/52; 329/204
[58] Field of Search .................. 332/46, 47, 52, 16 R, 332/23 R, 31 R, 43 R; 455/108, 109, 110, 326, 332; 329/204

[56] References Cited

U.S. PATENT DOCUMENTS

| | | | |
|---|---|---|---|
| 2,086,601 | 7/1937 | Caruthers | 332/52 |
| 2,086,602 | 7/1937 | Caruthers | 332/52 |
| 2,236,856 | 4/1941 | Penick | 332/52 |

*Primary Examiner*—Siegfried H. Grimm
*Assistant Examiner*—Edward P. Westin
*Attorney, Agent, or Firm*—Richard K. Robinson; Howard R. Greenberg; H. Fredrick Hamann

[57] ABSTRACT

A modulation device that has a means for minimizing the time required for the diodes to alternate conductive and nonconductive states. The modulation device as disclosed includes an input port for the signal that is to be mixed, a local oscillator port for the application of the switching signal and a sum port for providing the product of the two signals. Modulation is achieved by the operation of the diodes that are used as switches which are controlled by the local oscillator signal.

4 Claims, 4 Drawing Figures

MODULATION DEVICE FOR SUBSTITUTING FOR A DOUBLE BALANCED MIXER

BACKGROUND OF THE INVENTION

This invention relates to modulation devices. The Government has rights in this invention pursuant to Contract No. F19628-73-C-0116 awarded by the Department of the Navy.

Modulation devices such as balanced mixers have been around for many years, in fact, as early as 1927, copper oxide rectifiers were used for modulators for speech channels of carrier telephone systems in this country. The best available prior art of modulation devices is in an article entitled "Copper Oxide Modulators in Carrier Systems" by R. S. Caruthers presented at Winter Convention of AIEE, New York, N.Y., Jan. 23-27, 1939. In particular, reference should be made to FIG. 2C on page 318.

A classical modulation device such as the double balanced mixer referenced above had several difficulties associated with it. Primarily, these difficulties included overcoming the nonideal characteristics of the switching diodes and maintaining impedance integrity at all ports. The vastly improved diodes that are currently available require a threshold approximately from 0.4 volt to 1 volt to initiate conduction and exhibit a decreasing impedance until full saturation is achieved.

In the general application of modulation devices there is a local oscillator which generates one of the mixing signals. The power supply that drives the local oscillator must provide the current to switch the diodes. There is also a phase delay in the switching, because the mixing signal cannot instantaneously switch between positive and negative voltages at the point of phase reversal of a signal that is to be modulated. This phase delay distorts the switching characteristics and produces other undesirable effects. In addition, the classical modulation device does not provide a convenient impedance termination for the diode switching current, which results in standing waves that cause signal distortions and nonideal loading at the affected ports.

The traditional method of overcoming the above enumerated problems associated with modulation devices was to utilize various port terminals, filters and increased current rating of the local associated power supply.

SUMMARY OF THE INVENTION

A modulation device that has a means for minimizing the time required for the diodes to alternate conductive and nonconductive states.

The modulation device as disclosed includes an input port for the signal that is to be mixed, a local oscillator port for the application of the switching signal and a sum port for providing the product of the two signals. Modulation is achieved by the operation of nonlinear impedance devices that are used as switches which are controlled by the local oscillator signal.

The modulation device disclosed herein can be substituted by virtually any application which currently uses the double balanced mixer concept. Some examples of these concepts include heterodyne conversions, modulation, phase detection and pulse switching.

BRIEF DESCRIPTION OF THE DRAWINGS

In order that the invention may be readily carried into practice, a number of embodiments will now be described in detail by way of example, with reference to the accompanying drawings in which.

DETAILED DESCRIPTION OF THE PREFERRED EMBODIMENT

Figure 1:
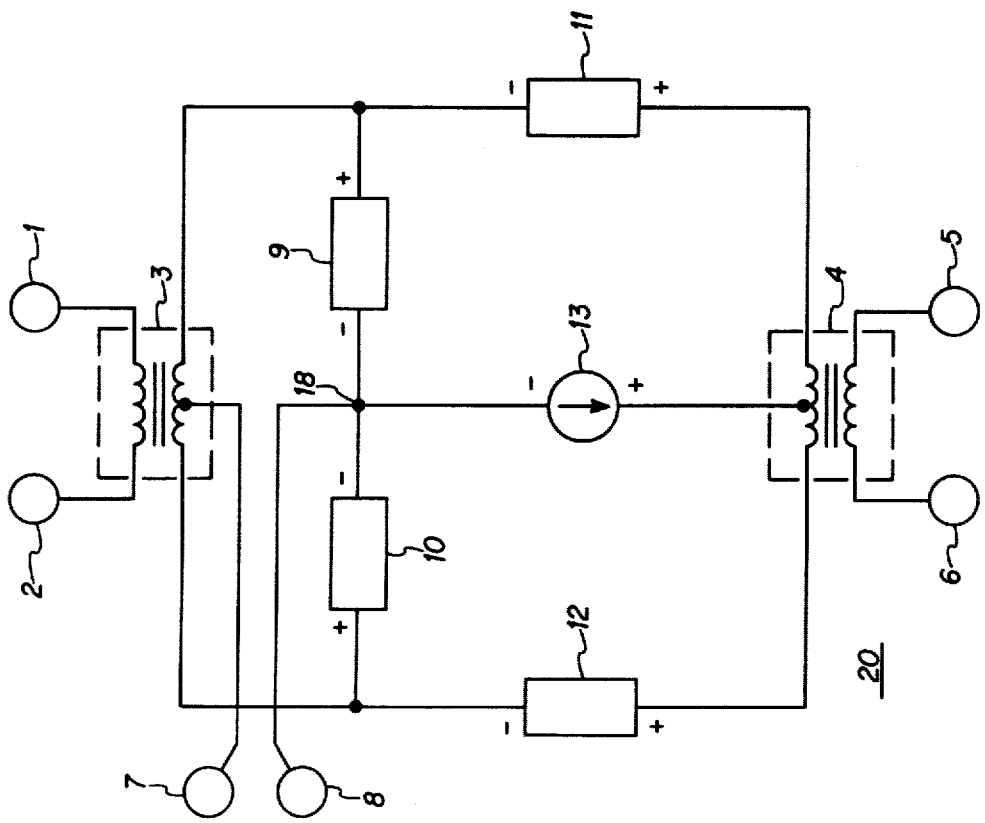
FIG. 1 is a simplified schematic diagram of a modulation device according to the invention.

In FIG. 1, to which reference should now be made, there is shown a modulation device 20 that consists of two transformers 3 and 4. The primary of transformer 3 is connected to terminals 1 and 2 which can be used to receive a complexed signal V(t) that is to be mixed in which V(t) can be represented by the equation:

$$V(t) = V_p \sin F_1 t / 2\pi$$

where $V_p \sin F_1/2\pi$ represents the output of a modulated signal that has a carrier frequency of $f_1$ and an amplitude of $V_p$.

Transformer 4 is used to receive a second signal V'(t) the switching signal that is generated by a local oscillator and is represented by:

$$V'(t) = \sin f_2 t / 2\pi$$

The product $V_s(t)$ of the two signals is provided on terminals 7 and 8, the sum port and is approximated by the equation of $V_s(t) = V(t) \times V'(t)$.

There are four nonlinear impedance devices 9, 10, 11 and 12 which are used as switching devices and a current source 13, that in conjunction with the two transformers 3 and 4, is arranged in the three port network shown in FIG. 1.

The modulation device transfers the power of the signal that is connected across the input terminals 1 and 2 to the sum port at terminals 7 and 8. The polarity of the signal that results from the mixing of the signal V(t) with the signal V'(t) is controlled by the signal that is applied to terminals 5 and 6, usually from a local oscillator.

The reversal of the polarity or phase of the current through the primary of transformer 4 causes the current source 13 to provide a switching current through the pair of nonlinear impedance devices (either devices 10 and 12 or devices 9 and 11) that were reverse biased at that instant to become forward biased and the other pair of nonlinear impedance devices that were forward biased at that instant to become reverse biased. For example, if nonlinear devices 9 and 11 were conducting and there was a reversal of the polarity of the signal applied to terminals 5 and 6, the local oscillator port, then the current passing through the primary of transformer 4 would cause the current source 13 to provide a current that would bias the nonlinear devices 9 and 11 to the off condition or cause the devices 9 and 11 to cease conduction and nonlinear devices 10 and 12 to initiate conduction. At the next polarity change of the signal that is present across terminals 5 and 6, the nonlinear devices 10 and 12 would cease conduction and nonlinear devices 9 and 11 would initiate conduction.

The alternation of the current at node point 18 which results from the alternation of the current through nonlinear devices 9 and 10 causes alternation of the magnitude of the impedance connecting each half of the secondary winding of transformer 3 and the sum port that includes terminals 7 and 8. The switching nature of the impedance alternation described above results in the transfer of the signal to the sum port with a superimposed phase reversal rate dictated by the signal that is applied to terminals 5 and 6.

Figure 2:
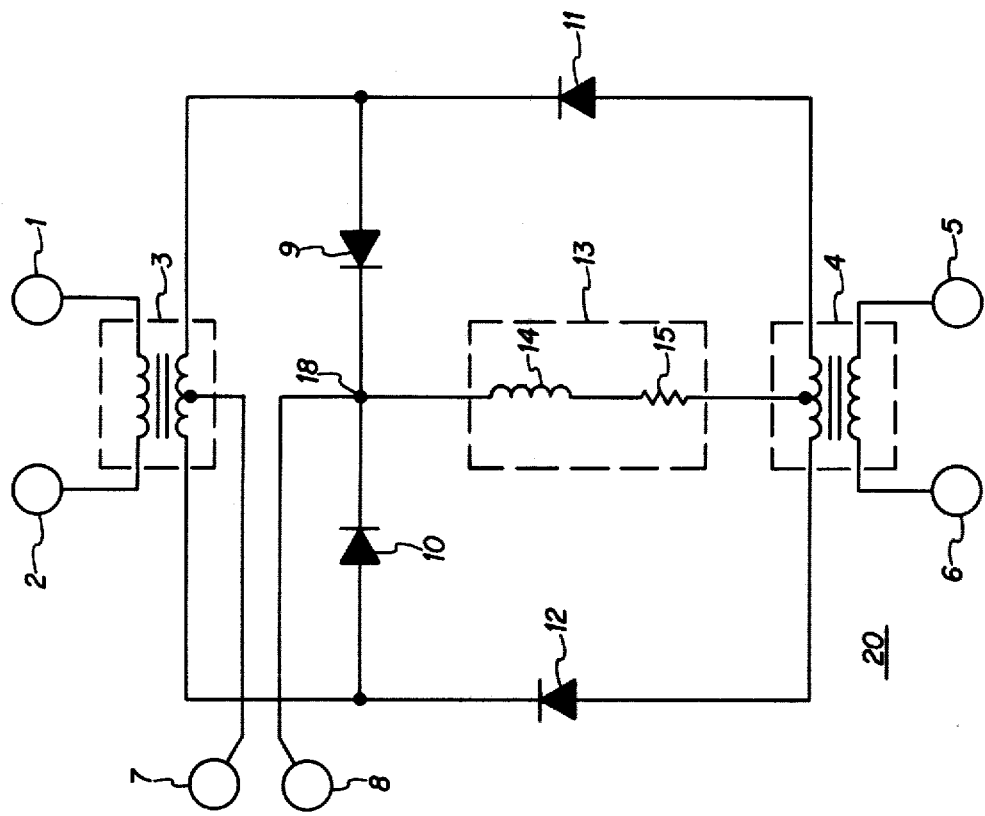
FIG. 2 is a schematic diagram of one embodiment of the invention.

In FIG. 2, the nonlinear devices 9, 10, 11 and 12 have been replaced by diodes 9, 10, 11 and 12 and the current source generates the switching current by the combination of an RL network that includes inductor or choke 14 and resistor 15.

Figure 3:
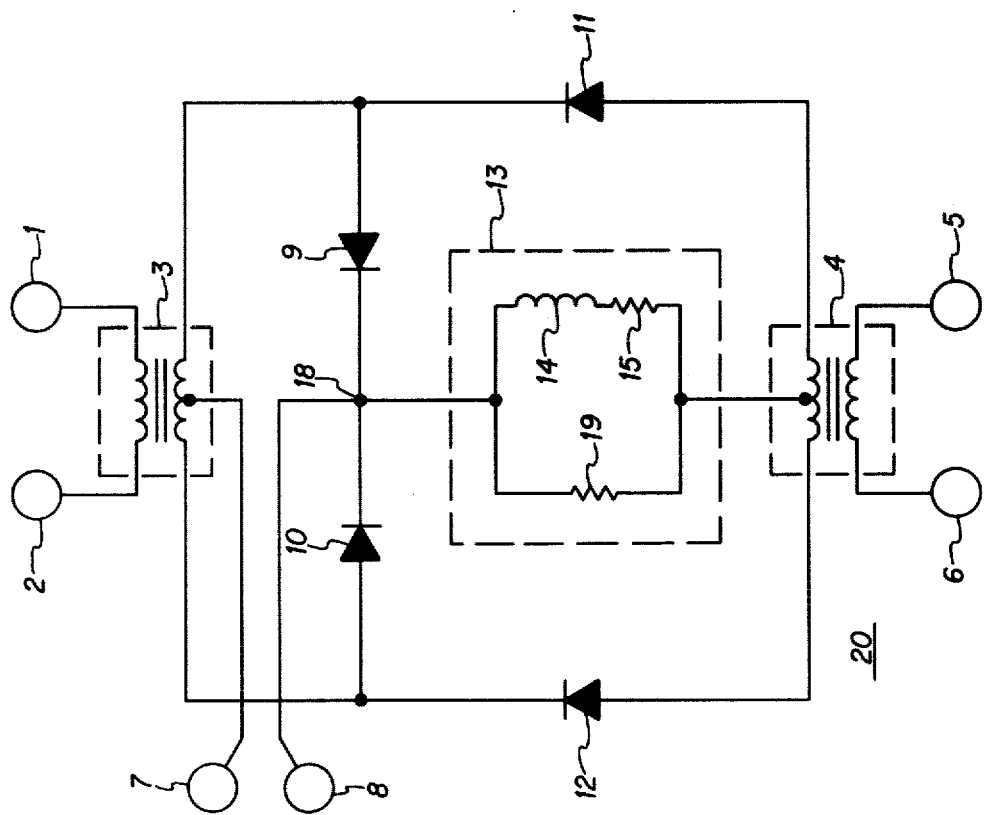
FIG. 3 is a schematic diagram of a second embodiment of the invention.

When the modulation device is applied to circuits that operate at higher frequencies, it has been found that the addition of a bipass resistor 19 to the RL combination increases the response of the current source 13 to polarity changes of the signal that is applied across terminals 5 and 6. An example of this embodiment is provided in FIG. 3.

Figure 4:
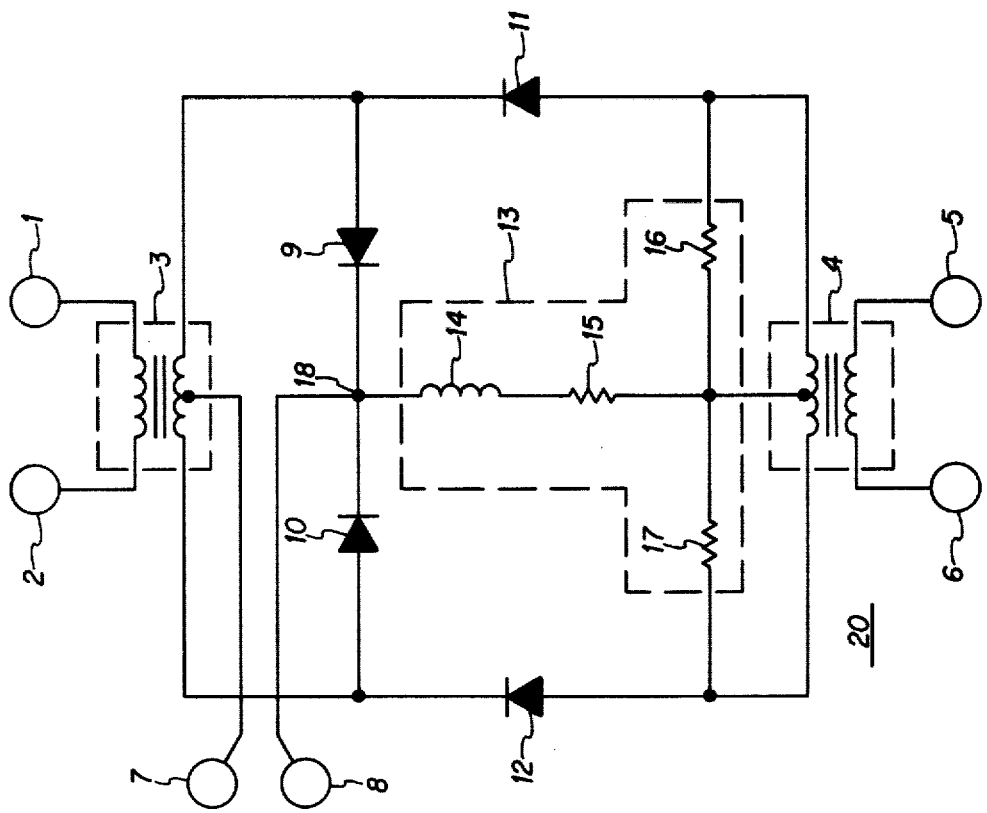
FIG. 4 is a schematic diagram of a third embodiment of the invention.

In FIG. 4, there is provided an embodiment of the invention which provides for the occasions when the modulation device is used in the audio range and there is an additional power requirement due to the loading on the terminals 7 and 8. This can be provided by the addition of resistors 16 and 17 to the current source that includes inductor 14 and resistor 15. Resistors 16 and 17 are connected in parallel with the secondary of transformer 4.

Many changes and modifications in the above described invention can, of course, be carried out without departing from the scope thereof. Accordingly, the invention is intended to be limited only by the scope of the appended claims.

I claim:

1. A modulation device, comprising:
   first and second pairs of diodes, each member of the first and second pairs of diodes being connected in series and wherein each diode has a conductive and nonconductive state;
   a first transformer means having a first primary winding for applying a first signal thereto and a first secondary winding with a first center tap wherein one end of the first secondary winding is connected to a junction of the members of the first pair of diodes and the other end of the first secondary winding is connected to a junction of the members of the second pair of diodes;
   a second transformer means having a second primary winding for applying a second signal thereto and a second secondary winding with a second center tap wherein one end of the second secondary winding is connected to a first end of the first pair of diodes and the other end is connected to a first end of the second pair of diodes;
   terminal means for joining a second end of the first and second pairs of diodes; and
   current source means connected between the second center tap and the terminal means for minimizing the time required for the first pair of diodes to alternate conductive and nonconductive states with the second pair of diodes when the first signal is applied to the first primary winding and the second signal is applied to the second primary winding and the product of the first and second signals is provided at a sum port that comprises the first center tap and the terminal means.

2. The modulation device according to claim 1 wherein the current source means, comprises:
   a series combination of a resistor and inductor.

3. The modulation device according to claim 1, wherein the current source means, comprises:
   an inductor and a first resistor connected in series arrangement; and
   a second resistor connected in parallel with the series arrangement of the first resistor and inductor.

4. The modulation device according to claim 1, wherein the current source means, comprises:
   a first resistor;
   an inductor connected in series with the first resistor; and
   a third and fourth resistor connected in shunt arrangement with the first resistor and inductor.

* * * * *